(12) United States Patent
Salsich

(10) Patent No.: US 11,167,366 B2
(45) Date of Patent: *Nov. 9, 2021

(54) METHODS AND APPARATUS FOR DETECTING LEAKAGE CURRENT

(71) Applicant: Illinois Tool Works Inc., Glenview, IL (US)

(72) Inventor: Anthony Salsich, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/744,747

(22) Filed: Jan. 16, 2020

(65) Prior Publication Data

US 2020/0150190 A1  May 14, 2020

Related U.S. Application Data

(63) Continuation of application No. 15/589,415, filed on May 8, 2017, now Pat. No. 10,539,604.

(51) Int. Cl.
*G01R 31/50* (2020.01)
*B23K 37/00* (2006.01)
(Continued)

(52) U.S. Cl.
CPC .......... *B23K 9/0953* (2013.01); *B23K 10/006* (2013.01); *B23K 11/257* (2013.01);
(Continued)

(58) Field of Classification Search
CPC ...... G01R 31/00; G01R 31/02; G01R 31/024; G01R 31/025; G01R 31/12; G01R 31/1227; G01R 31/1245; G01R 31/1263; G01R 31/1272; G01R 27/00; G01R 27/02; G01R 27/16; G01R 27/18; G01R 27/26;
(Continued)

(56) References Cited

U.S. PATENT DOCUMENTS 4,375,026 A   2/1983 Kearney
5,038,016 A   8/1991 Robertson
(Continued)

FOREIGN PATENT DOCUMENTS

CN   202084904   12/2011
CN   102593802   7/2012
(Continued)

OTHER PUBLICATIONS

"Lock-in amplifier", https://en.wikipedia.org/wiki/Lock-in_amplifier, retrieved May 8, 2017 (pp. 5).
(Continued)

*Primary Examiner* — Hoai-An D. Nguyen
(74) *Attorney, Agent, or Firm* — McAndrews, Held & Malloy, Ltd.

(57) ABSTRACT

An example apparatus to monitor a welding-type system includes: a test signal generator configured to output a test signal to a monitored circuit; and a lock-in amplifier configured to: receive a reference signal based on the test signal; measure a leakage current in the monitored circuit based on the reference signal; and generate an output signal representative of the leakage current.

19 Claims, 3 Drawing Sheets

(51) Int. Cl.
*B23K 11/25* (2006.01)
*B23K 13/08* (2006.01)
*B23K 9/095* (2006.01)
*B23K 10/00* (2006.01)
*G01R 31/52* (2020.01)

(52) U.S. Cl.
CPC ............ B23K 11/258 (2013.01); B23K 13/08 (2013.01); B23K 37/006 (2013.01); G01R 31/52 (2020.01)

(58) Field of Classification Search
CPC .... G01R 27/2617; G01R 31/50; G01R 31/52; B23K 9/00; B23K 9/095; B23K 9/0953; B23K 10/00; B23K 10/006; B23K 11/257; B23K 13/00; B23K 13/08; B23K 37/006
USPC ....... 324/500, 510, 512, 527, 528, 530, 531, 324/536, 537, 541, 544, 551, 555, 557, 324/750.01, 72, 72.5; 340/500, 540, 635, 340/647
See application file for complete search history.

(56) References Cited

U.S. PATENT DOCUMENTS

| | | | |
|---|---|---|---|
| 5,349,156 A | 9/1994 | Madigan | |
| 5,742,023 A * | 4/1998 | Fortmann | B23K 11/258 219/109 |
| 6,347,025 B1 * | 2/2002 | Ulrich | H02H 3/162 361/42 |
| 6,388,927 B1 | 5/2002 | Churchill | |
| 6,914,440 B2 * | 7/2005 | Matuschek | B23K 9/10 219/109 |
| 7,171,993 B2 | 2/2007 | Bethuy | |
| 2005/0225909 A1 * | 10/2005 | Yoshizaki | H02H 3/042 361/42 |
| 2007/0252602 A1 * | 11/2007 | Kuroiwa | H03F 3/45475 324/523 |
| 2011/0108536 A1 | 5/2011 | Inada | |
| 2013/0043889 A1 * | 2/2013 | Guo | G11C 29/02 324/659 |
| 2013/0215696 A1 * | 8/2013 | Choi | G11C 29/028 365/201 |

FOREIGN PATENT DOCUMENTS

| | | |
|---|---|---|
| CN | 103034103 | 4/2013 |
| CN | 103792459 | 5/2014 |
| CN | 204449595 | 7/2015 |
| CN | 106159890 | 11/2016 |

OTHER PUBLICATIONS

"Principles of lock-in detection and the state of the art" with embedded video, Zurich Instruments, Nov. 23, 2016 (18 pages).
"Principles of lock-in detection and the state of the art", Zurich Instruments Release date: Nov. 23, 2016 (10 pages).
Andrea De Marcellis et al: "Detection of Small and Noisy Signals in Sensor Interfacing: The Analog Lock-in Amplifier" In: Analog Circuits and Systems for Voltage-Mode and Current-Mode Sensor Interfacing Applications, Sep. 26, 2011 (Sep. 26, 2011), Springer Netherlands, Dordrecht, XP055489987, ISBN: 978-90-48-19828-3 pp. 181-204.
Int'l Search Report and Written Opinion for PCT/US2018/029766 dated Aug. 7, 2018 (16 pgs.).

* cited by examiner

METHODS AND APPARATUS FOR DETECTING LEAKAGE CURRENT

BACKGROUND

The invention relates generally to welding-type systems, and more particularly to methods and apparatus for detecting leakage current.

Welding, plasma cutting, and induction heating power supplies are well known. Typically, such power supplies do not have a ground fault interrupt circuit, but rather include reduced open circuit output voltages, low current, high frequency starting circuits, and cautionary labels. However, it is difficult to provide a reduced output voltage for induction heating. Ground fault interrupting circuits are known outside the welding, plasma cutting, and induction heating industry, but using known ground fault interrupting circuits in the welding, plasma cutting, and induction heating industry is difficult because of the nature of the power supplies and the environments in which they are used.

It is desirable to have a welding, plasma cutting, and/or induction heating power supply with a low voltage ground fault protection circuit that has a low current threshold but is not adversely susceptible to the high frequency noise typically generated by welding, plasma cutting, and induction heating power supplies.

SUMMARY

Methods and apparatus for detecting leakage current are disclosed, substantially as illustrated by and described in connection with at least one of the figures, as set forth more completely in the claims.

BRIEF DESCRIPTION OF THE DRAWINGS

The figures are not necessarily to scale. Where appropriate, similar or identical reference numbers are used to refer to similar or identical components.

DETAILED DESCRIPTION

Figure 1:
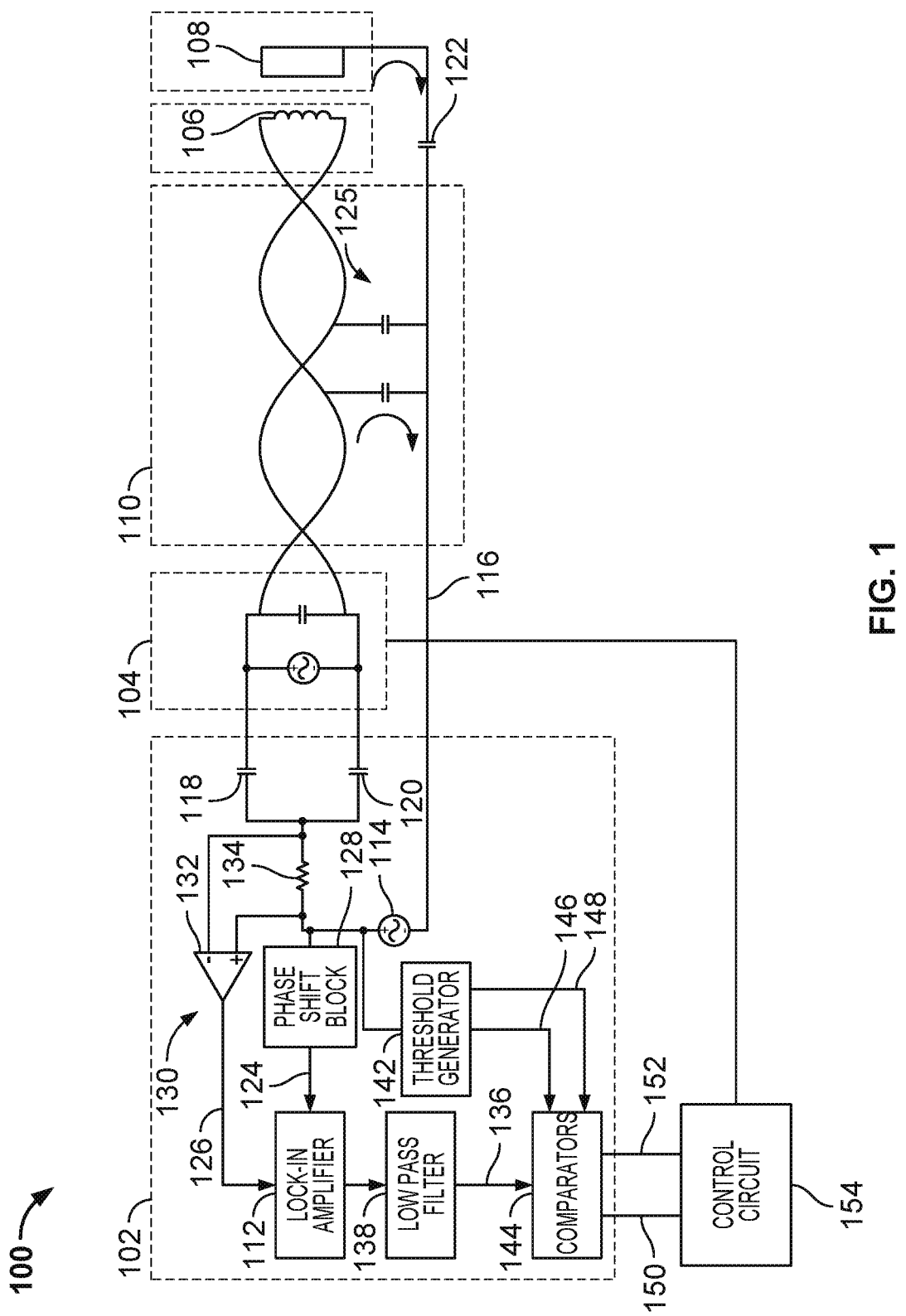
FIG. 1 illustrates an example induction heating system including a leakage detection circuit, in accordance with aspects of this disclosure.

Disclosed example welding-type power supplies include a leakage detection circuit that is capable of reliable low voltage operation in high noise environments. In some examples, a lock-in amplifier (aka, synchronous demodulator) is used to detect excessive leakage current between the welding-type circuit and a work piece. In some examples, a low voltage AC test signal is applied to the welding-type circuit and the resulting current is measured. The lock-in amplifier is tuned to the frequency and phase of the test signal, and rejects all other signals.

In some examples, a window comparator is used to detect excessive leakage current and a lower limit leakage current expected for normal system operation. The lower limit current may be expected from parasitic capacitances in an extension cable connected to the welding-type power source. If these capacitances are not detected, some example systems alert the user that either the extension cable is not connected or the test circuit is not working properly, and/or disable output of welding-type power.

As used herein, a "circuit" includes any analog and/or digital components, power and/or control elements, such as a microprocessor, digital signal processor (DSP), software, and the like, discrete and/or integrated components, or portions and/or combinations thereof.

Disclosed example apparatus to monitor a welding-type system include a test signal generator and a lock-in amplifier. The test signal generator outputs a test signal to a welding-type circuit. The lock-in amplifier receives a reference signal based on the test signal, measures a leakage current in the welding-type circuit based on the reference signal, and generates an output signal representative of the leakage current.

Some examples further include a comparator to compare the output signal to a threshold to determine whether at least a threshold leakage current is present in the welding-type circuit. Some such examples further include a threshold generator to determine the threshold based on the test signal. In some examples, the comparator indicates that the welding-type circuit is coupled to the test signal generator and the lock-in amplifier when at least the threshold leakage current is present.

Some examples include a comparator to compare the output signal to a threshold to determine whether less than a threshold leakage current is present in the welding-type circuit. In some such examples, the comparator indicates a current leakage fault is present in the welding-type circuit when at least the threshold leakage current is present.

In some examples, the test signal generator and the lock-in amplifier are capacitively coupled to the welding-type circuit via a welding-type power supply. In some examples, the test signal generator generates the test signal at a frequency different than a welding-type frequency output by the welding-type power supply to the welding-type circuit. In some examples, the welding-type circuit is at least one of an inductive heating cable to be inductively coupled to a workpiece to be heated, a resistive heating cable, a welding cable to provide welding current to a welding torch, a plasma cable to provide current to a plasma torch, or an extension cable to be coupled between a welding-type power supply and the inductive heating cable, the resistive heating cable, the welding cable, or the plasma cable.

Some examples further include a feedback cable to be coupled to a workpiece to be worked on using the welding-type circuit and to provide the leakage current to the lock-in amplifier. Some example apparatus further include a control circuit to enable or disable a welding-type power supply in response to the output signal.

Disclosed example methods include: outputting a test signal from a test signal generator to a welding-type circuit; receiving, at a lock-in amplifier, a reference signal based on the test signal; measuring, with the lock-in amplifier, a leakage current in the welding-type circuit based on the reference signal; and generating, with the lock-in amplifier, an output signal based on the leakage current.

Some example methods further involve comparing, with a circuit, the output signal to at least one of a first threshold or a second threshold to determine at least one of: 1) whether at least an upper threshold leakage current is present in the welding-type circuit; or 2) whether less than a lower threshold leakage current is present in the welding-type circuit. Some examples further involve generating at least one of the first threshold or the second threshold based on the test signal. Some example methods further involve outputting a signal indicating that the welding-type circuit is coupled to a test signal generator and the lock-in amplifier when at least the lower threshold leakage current is present.

Some example methods further involve outputting a signal indicating a current leakage fault is present in the welding-type circuit when at least the upper threshold leakage current is present. In some examples, outputting the test signal involves generating the test signal at a frequency different than a welding-type frequency output by a welding-type power supply to the welding-type circuit. Some example methods further involve enabling or disabling a welding-type power supply in response to the output signal.

The figures are described below with reference to induction heating and inductively heating a workpiece. However, the disclosed examples are applicable to other welding-type power supplies and welding-type circuits. As used herein, the term "welding-type circuit" includes any combination of devices and/or circuit components capable of converting, delivering, generating, and/or otherwise supplying, to a workpiece, power suitable for welding, plasma cutting, induction and/or resistive heating, CAC-A and/or hot wire welding/preheating (including laser welding and laser cladding), including inverters, converters, choppers, resonant power supplies, quasi-resonant power supplies, etc., as well as control circuitry and other ancillary circuitry associated therewith. As used herein, the term "welding-type power supply" refers to a power supply suitable for providing power for welding, plasma cutting, induction and/or resistive heating, CAC-A and/or hot wire welding/preheating (including laser welding and laser cladding). As used herein, the term "welding-type frequency" refers to a frequency of power suitable for welding, plasma cutting, induction and/or resistive heating, CAC-A and/or hot wire welding/preheating (including laser welding and laser cladding) output from a welding-type power supply.

FIG. 1 illustrates an example induction heating system 100 (e.g., a welding-type system) including a leakage detection circuit 102. The induction heating system 100 is configured to provide power from an induction heating power source 104 to an induction heating coil 106. The induction heating coil 106 is magnetically coupled to a workpiece 108 that is to be heated via the induction heating coil 106. In operation, the induction heating power source 104 outputs power to the induction heating coil 106 at a heating frequency, which transfers the power to the workpiece 108 to inductively heat the workpiece 108. As illustrated in FIG. 1, the induction heating power source 104 may be coupled to the induction heating coil 106 via an extension cable 110. The example leakage detection circuit 102 may be included in an enclosure of the induction power source 104 and coupled to the induction heating circuit.

The example leakage detection circuit 102 of FIG. 1 includes a lock-in amplifier 112 and a test signal generator 114. The test signal generator 114 outputs a test signal to the induction heating circuit (e.g., the induction power source 104, the extension cable 110, and the induction heating coil). The test signal generator 114 is configured to generate the test signal at a frequency different than a welding-type frequency (e.g., an induction heating frequency) output by the induction power source 104 to the induction heating circuit. The test signal may be a low voltage test signal.

The lock-in amplifier 112 attempts to measure a leakage current in the induction heating circuit. A feedback cable 116 is coupled to the workpiece 108 and to the leakage detection circuit 102 to provide a path to the lock-in amplifier 112 for leakage current resulting from the test signal. Leakage current may result from capacitive coupling between the extension cable 110 and the feedback cable 116 and/or from a failure of electrical insulation in the induction heating coil 106 causing current leakage between the induction heating coil and the workpiece 108.

The test signal generator 114 is capacitively coupled to the induction heating circuit via capacitive elements 118, 120. The test signal generator 114 is capacitively coupled to the workpiece 108 via a capacitive element 122 in the feedback cable 116. For example, the capacitive element 122 may be included in a connector that makes electrical contact with the workpiece 108. As illustrated by capacitive elements 125, the feedback cable 116 may also be capacitively coupled to the extension cable 110 via parasitic capacitance. In the example of FIG. 1, the feedback cable 116 is included in an outer jacket of the extension cable 110 to ensure at least a lower limit of parasitic capacitance between the extension cable 110 and the feedback cable 116. As described below, identification of the parasitic capacitance enables the leakage detection circuit 102 to identify whether the extension cable 110 and/or the induction heating coil 106 are connected to the induction power source 104.

The lock-in amplifier 112 receives a timing reference signal 124 that is based on the test signal output by the test signal generator 114. The lock-in amplifier 112 also receives a current signal 126 that is representative of the leakage current in the induction heating circuit. In the example of FIG. 1, the leakage detection circuit 102 includes a phase shift block 128 that applies a phase shift to the test signal to generate the timing reference signal 124. The phase shift block 128 may be tuned so that the timing reference signal 124 has a similar phase as the current signal 126. The phase shift block 128 may apply a phase shift to the test signal based on the expected capacitance values of the capacitive elements 118, 120, 122 and of the expected parasitic capacitance, which result in a phase shift between the test signal and the current signal 126.

To generate the current signal 126, the example leakage detection circuit 102 includes a current sense circuit 130 including a differential amplifier 132 and a current sense resistor 134 having a predetermined resistance.

The lock-in amplifier 112 measures the leakage current in the induction heating circuit, represented by the current signal 126, based on the timing reference signal 124. The lock-in amplifier 112 outputs an output signal 136, which may be filtered by a low pass filter 138 (e.g., to limit the output signal to a lower frequency or DC component of the output signal 136.

The example leakage detection circuit 102 includes a leakage alarm circuit 140 to determine whether the leakage current measured by the lock-in amplifier 112 (represented by the filtered output signal 136) is within an acceptable range of leakage current values. As mentioned above, the induction heating circuit may, intentionally or unintentionally, have at least a lower leakage current when the extension cable 110 and the heating coil 106 are properly connected to the induction power source 104. Leakage current above an upper limit may indicate a problem with the extension cable 110 and/or the heating coil 106. The example leakage detection circuit 102 determines whether the leakage current resulting from the test signal is within a range between the upper limit and the lower limit.

The leakage alarm circuit 140 includes a threshold generator 142 and one or more comparator(s) 144. The threshold generator 142 generates amplitude reference signal(s) 146, 148 from the test signal output by the test signal generator 114. In this manner, the values of the amplitude reference signal(s) 146, 148 reflect any variations in the test signal. If the test signal generator 114 is capable of generating a stable output, the example amplitude reference signals 146, 148 may be generated using constant values. The amplitude reference signal(s) 146, 148 represent the upper leakage current limit and/or the lower leakage current limit. The example comparator(s) 144 compare the output signal 136 to the amplitude reference signals 146, 148 to determine whether the output signal 136 is within the range of leakage currents between the upper and lower limits.

The comparator(s) 144 compare the output signal 136 to a first threshold to determine whether at least an upper threshold leakage current is present in the induction heating circuit and/or compare the output signal 136 to a second threshold to determine whether less than a lower threshold leakage current is present in the induction heating circuit. The comparators 144 output alarm signals 150, 152 to a control circuit 154 based on the comparisons. The alarm signals 150, 152 may be output at a predetermined signal level when a corresponding one of the comparators 144 determines that the output signal 136 is greater than the upper amplitude reference signal 146 or lower than the lower amplitude reference signal 148.

The control circuit 154 enables and/or disables the induction power source 104 in response to the alarm signals 150, 152. For example, if the output signal 136 is higher than the amplitude reference signal 146 corresponding to the upper leakage current limit, the control circuit 154 receives the alarm signal 150 indicating that a current leakage fault is present in the induction heating circuit and, in response, may command the induction power source 104 to disable output power. Similarly, if the output signal 136 is lower than the amplitude reference signal 148 corresponding to the lower leakage current limit, the control circuit 154 receives the alarm signal 152 indicating that the test signal generator 114 and the lock-in amplifier 112 (or, more generally, the leakage detection circuit) is not coupled to the induction power source 104, the extension cable 110, and/or the induction heating coil 106 (or, more generally, the induction heating circuit). In response, the control circuit 154 may command the induction power source 104 to disable the output power. In some examples, the control circuit 154 is a same control circuit and/or processing circuit that controls the operation of the welding-type power supply (e.g., the induction power source), including controlling conversion of input power to output welding-type power (e.g., induction heating power).

While the example threshold generator 142 generates both amplitude reference signals 146, 148 and the comparator(s) 144 include multiple comparators for comparing the output signal 136 to the amplitude reference signals 146, 148, in other examples the threshold generator 142 generates an amplitude reference signal for only one of the upper limit or the lower limit and the leakage alarm circuit 140 includes only one comparator to compare the output signal 136 to the amplitude reference signal.

Figure 2:
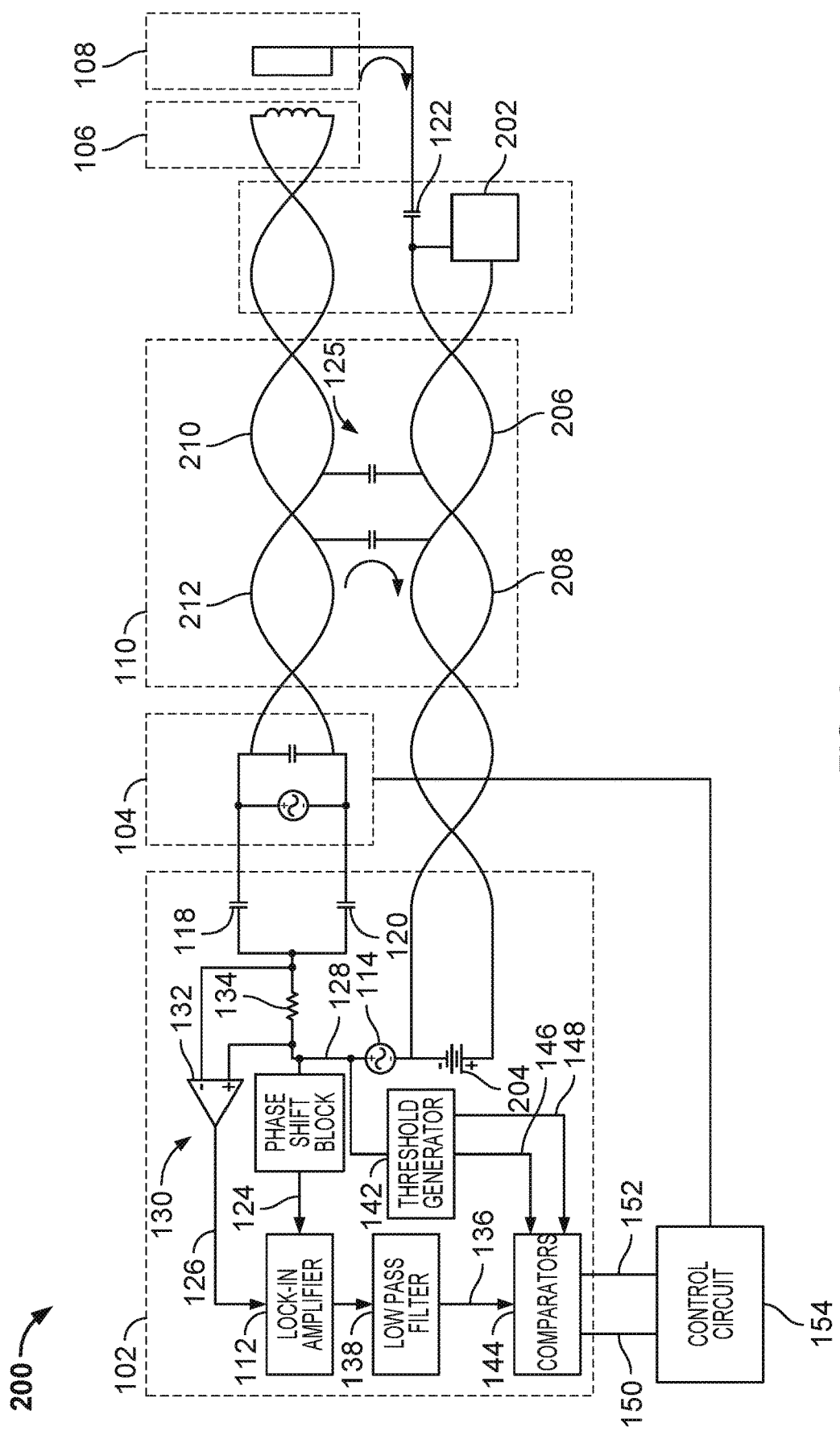
FIG. 2 illustrates another example induction heating system including a leakage detection circuit, in accordance with aspects of this disclosure.

FIG. 2 illustrates another example induction heating system 200 including the leakage detection circuit 102. The example induction heating system 200 includes the leakage detection circuit 102, the induction power source 104, the extension cable 110, the induction heating coil 106, and the workpiece 108 described above in FIG. 1. In contrast with the example system 100 of FIG. 1, in which the feedback cable 116 is provided to conduct the leakage current, in the example of FIG. 2 the system 200 includes one or more auxiliary circuits 202 that are remotely powered from an auxiliary power supply 204 via auxiliary conductors 206, 208.

The auxiliary power supply 204 delivers DC power to the auxiliary circuits 202, which may include sensors, processing, communications, and/or any other circuits that may be useful closer to the workpiece 108 than the physical location of the induction power source 104. The auxiliary conductors 206, 208 are included within an outer jacket of the example extension cable 110 and may be terminated separately from the conductors 210, 212 that are in the induction heating circuit. In the example system 200 of FIG. 2, one of the auxiliary conductors (e.g., the auxiliary conductor 208) is capacitively coupled to the workpiece 108 to conduct leakage current for measurement by the lock-in amplifier 112.

As mentioned above, the disclosed examples are applicable to welding-type systems and welding-type circuits other than induction heating systems and induction heating circuits. Example welding-type circuits with which the disclosed examples may be used include at least one of: a heating cable configured to be inductively coupled to a workpiece to be heated; a welding cable configured to provide welding current to a welding torch; a plasma cable configured to provide current to a plasma torch; or an extension cable configured to be coupled between a welding-type power supply and the heating cable, the welding cable, or the plasma cable.

Example methods of processing the output from the lock-in amplifier 112 are disclosed above. However, the output of the lock-in amplifier 112 (e.g., the output signal 136) may be processed in other ways and/or using other types of circuits from the specific circuits described. For example, any combination of digital and/or analog circuits may be used to process the leakage current measurement and/or use the leakage current measurement for control of a welding-type system.

Figure 3:
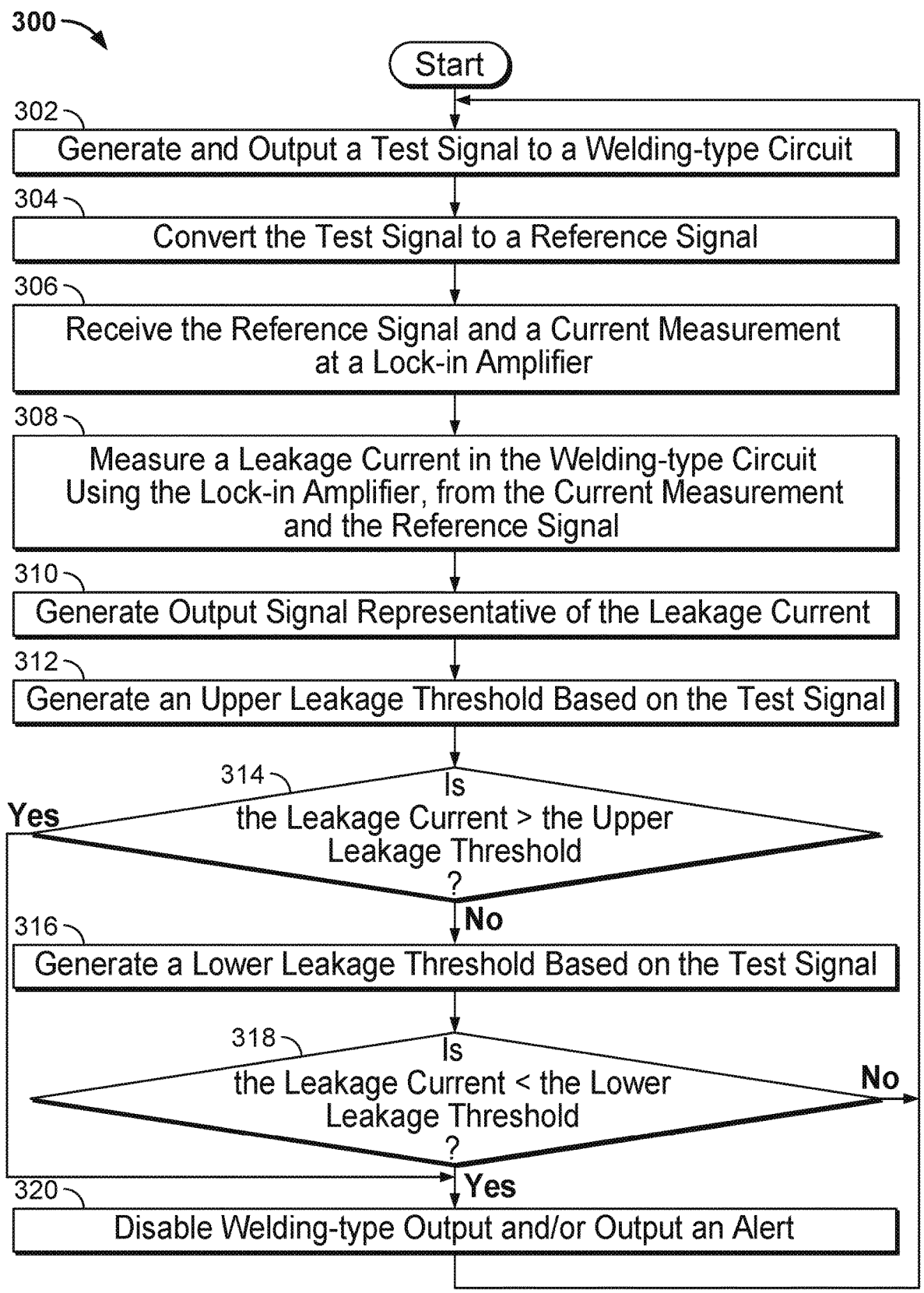
FIG. 3 is a flowchart representative of an example method to measure leakage in a welding-type circuit.

FIG. 3 is a flowchart representative of an example method 300 to measure leakage in a welding-type circuit. The example method 300 is described below with reference to the induction heating system 100 of FIG. 1, but may be applied to any other welding-type system, welding-type power supply, and/or welding-type circuit to measure leakage.

At block 302, the example test signal generator 114 generates and outputs a test signal to a welding-type circuit (e.g., the induction heating circuit of FIG. 1). For example, the test signal generator 114 may generate a low voltage test signal at a frequency different than a welding-type frequency.

At block 304, the phase shift block 128 converts the test signal to the timing reference signal 124. For example, the phase shift block 128 may adjust the phase of the test signal based on an expected phase shift in the leakage current relative to the test signal.

At block 306, the lock-in amplifier 112 receives the timing reference signal 124 and a current measurement (e.g., the current signal 126). At block 308, the lock-in amplifier 112 measures a leakage current in the welding-type circuit using the current signal 126 and the timing reference signal 124.

At block 310, the lock-in amplifier 112 generates an output signal 136 representative of the measured leakage current. For example, the lock-in amplifier 112 may determine an amplitude and phase of the current signal 126 with reference to the timing reference signal 124 to output a DC signal having an amplitude corresponding to the measured leakage current.

At block 312, the threshold generator 142 generates an upper leakage threshold based on the test signal. The upper leakage threshold corresponds to an upper limit on leakage current, above which the leakage current may be considered to be excessive for operation of the welding-type system. At block 314, the comparator(s) 144 determine whether the leakage current is greater than the upper leakage threshold.

If leakage current is not greater than the upper leakage threshold (block 314), at block 316 the threshold generator 142 generates a lower leakage threshold based on the test signal. The lower leakage threshold corresponds to a lower limit on leakage current, below which the leakage current may be considered to indicate that the welding-type circuit is not properly connected for operation of the welding-type system. At block 318, the comparator(s) 144 determine whether the leakage current is less than the lower leakage threshold.

If leakage current is greater than the upper leakage threshold (block 314) or if the leakage current is less than the lower leakage threshold (block 318), at block 320 the control circuit 154 disables a welding-type output and/or outputs an alert (e.g., via a user interface). For example, the control circuit 154 may control a welding-type power supply to disable output of welding-type power. Conversely, if the leakage current is neither greater than the upper leakage threshold (block 314) nor less than the lower leakage threshold (block 318), control returns to block 302 to continue monitoring the leakage current.

While blocks 302-320 are described above as discrete functions in an example sequence, the example leakage detection circuit 102 may perform one or more of the blocks 302-320 on a substantially continuous basis during operation.

While some examples above are described with reference to induction heating, the examples may be modified to be used for resistive heating, in which a heating cable provides electrical power to a heating element (or serves as the heating element) which is heated via I$^2$R heating and thermally coupled to a workpiece to be heated. The examples described above may be modified to communicate via the resistive heating cable based on the application heating power and/or heating frequencies in the heating cable.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, block and/or components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. An apparatus to monitor a welding-type system, comprising:
   a test signal generator configured to output a test signal to a monitored circuit; and
   a lock-in amplifier configured to:
      receive a reference signal based on phase-shifting the test signal;
      measure a leakage current in the monitored circuit based on the reference signal; and
      generate an output signal representative of the leakage current.

2. The apparatus as defined in claim 1, further comprising a comparator configured to compare the output signal to a threshold to determine whether at least a threshold leakage current is present in the monitored circuit.

3. The apparatus as defined in claim 2, further comprising a threshold generator configured to determine the threshold based on the test signal.

4. The apparatus as defined in claim 2, wherein the comparator is configured to indicate that the monitored circuit is coupled to the test signal generator and the lock-in amplifier when at least the threshold leakage current is present.

5. The apparatus as defined in claim 1, further comprising a comparator configured to compare the output signal to a threshold to determine whether less than a threshold leakage current is present in the monitored circuit.

6. The apparatus as defined in claim 5, wherein the comparator is configured to indicate a current leakage fault is present in the monitored circuit when at least the threshold leakage current is present.

7. The apparatus as defined in claim 5, further comprising a threshold generator configured to determine the threshold based on the test signal.

8. The apparatus as defined in claim 1, wherein the test signal generator and the lock-in amplifier are capacitively coupled to the monitored circuit via a power supply.

9. The apparatus as defined in claim 1, further comprising a control circuit configured to enable or disable a power supply in response to the output signal.

10. The apparatus as defined in claim 1, wherein the monitored circuit is at least one of an inductive heating cable configured to be inductively coupled to a workpiece to be heated, a resistive heating cable, a welding cable configured to provide welding current to a welding torch, a plasma cable configured to provide current to a plasma torch, or an extension cable configured to be coupled between a power supply and the inductive heating cable, the resistive heating cable, the welding cable, or the plasma cable.

11. The apparatus as defined in claim 1, further comprising a feedback cable configured to be coupled to a workpiece to be worked on using the welding-type circuit and configured to provide the leakage current to the lock-in amplifier.

12. An apparatus to monitor a welding-type system, comprising:
- a test signal generator configured to output a test signal to a monitored circuit, wherein the test signal generator is configured to generate the test signal at a first frequency different than a second frequency output by the power supply to the monitored circuit; and
- a lock-in amplifier configured to:
  - receive a reference signal based on the test signal;
  - measure a leakage current in the monitored circuit based on the reference signal; and
  - generate an output signal representative of the leakage current.

13. A method, comprising:
- generating the test signal at a first frequency different than a second frequency output by a power supply to a monitored circuit;
- outputting a test signal from a test signal generator to the monitored circuit;
- receiving, at a lock-in amplifier, a reference signal based on the test signal;
- measuring, with the lock-in amplifier, a leakage current in the monitored circuit based on the reference signal; and
- generating, with the lock-in amplifier, an output signal based on the leakage current.

14. The method as defined in claim 13, further comprising comparing, with a circuit, the output signal to at least one of a first threshold or a second threshold to determine at least one of: 1) whether at least an upper threshold leakage current is present in the monitored circuit; or 2) whether less than a lower threshold leakage current is present in the monitored circuit.

15. The method as defined in claim 14, further comprising generating at least one of the first threshold or the second threshold based on the test signal.

16. The method as defined in claim 14, further comprising outputting a signal indicating that the monitored circuit is coupled to a test signal generator and the lock-in amplifier when at least the lower threshold leakage current is present.

17. The method as defined in claim 14, further comprising outputting a signal indicating a current leakage fault is present in the monitored circuit when at least the upper threshold leakage current is present.

18. The method as defined in claim 13, further comprising enabling or disabling a power supply in response to the output signal.

19. The method as defined in claim 13, wherein the monitored circuit is at least one of an inductive heating cable configured to be inductively coupled to a workpiece to be heated, a resistive heating cable, a welding cable configured to provide welding current to a welding torch, a plasma cable configured to provide current to a plasma torch, or an extension cable configured to be coupled between a power supply and the inductive heating cable, the resistive heating cable, the welding cable, or the plasma cable.

* * * * *